(12) United States Patent
Bonakdar et al.

(10) Patent No.: US 11,362,124 B2
(45) Date of Patent: Jun. 14, 2022

(54) IMAGE SENSORS WITH QUANTUM EFFICIENCY ENHANCED BY INVERTED PYRAMIDS

(71) Applicant: OmniVision Technologies, Inc., Santa Clara, CA (US)

(72) Inventors: Alireza Bonakdar, San Jose, CA (US); Zhiqiang Lin, San Jose, CA (US); Bill Phan, San Jose, CA (US); Badrinath Padmanabhan, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 74 days.

(21) Appl. No.: 16/777,193

(22) Filed: Jan. 30, 2020

(65) Prior Publication Data

US 2021/0242265 A1 Aug. 5, 2021

(51) Int. Cl.
*H01L 27/14* (2006.01)
*H01L 27/146* (2006.01)

(52) U.S. Cl.
CPC .. *H01L 27/14632* (2013.01); *H01L 27/14621* (2013.01); *H01L 27/14627* (2013.01)

(58) Field of Classification Search
CPC ......... H01L 27/14632; H01L 27/14621; H01L 27/14627; H01L 27/14649; H01L 27/14689; H01L 27/14694; H01L 27/14607; H01L 27/14623; H01L 31/1035; H01L 27/1463; H01L 27/14636; H01L 27/1464; H01L 31/03529; H01L 31/035281; Y02E 10/50
USPC ..................................... 257/432; 438/48, 65
See application file for complete search history.

(56) References Cited

U.S. PATENT DOCUMENTS

| 4,348,254 A * | 9/1982 | Lindmayer ......... H01L 21/3081 438/71 |
| 8,530,266 B1 | 9/2013 | Chen et al. |
| 8,716,594 B2 * | 5/2014 | Dutta ................. H01L 31/0547 136/256 |
| 9,780,131 B1 | 10/2017 | Woo et al. |
| 9,954,020 B1 | 4/2018 | Lu et al. |
| 2016/0049430 A1 | 2/2016 | Nomura |

(Continued)

FOREIGN PATENT DOCUMENTS

| CN | 103399368 A | 11/2013 |
| CN | 203365711 U | 12/2013 |

OTHER PUBLICATIONS

Chang, et al. "Shape-controlled, high fill-factor microlens arrays fabricated by a 3D diffuser lithography and plastic replication method." Optics Express 12.25 (2004): 6366-6371.

(Continued)

*Primary Examiner* — Didarul A Mazumder
(74) *Attorney, Agent, or Firm* — Lathrop GPM LLP

(57) ABSTRACT

An image sensor with quantum efficiency enhanced by inverted pyramids includes a semiconductor substrate and a plurality of microlenses. The semiconductor substrate includes an array of pixels. Each of the pixels is configured to convert light incident on the pixel to an electrical output signal, the semiconductor substrate having a top surface for receiving the light. The top surface forms a plurality of inverted pyramids in each pixel. The plurality of microlenses are disposed above the top surface and aligned to the plurality of inverted pyramids, respectively.

14 Claims, 7 Drawing Sheets

(56) References Cited

U.S. PATENT DOCUMENTS

2017/0352771 A1* 12/2017 Gu ..................... G02B 3/0056
2018/0084185 A1   3/2018 Lu et al.
2019/0096945 A1   3/2019 Lu et al.
2021/0183924 A1*  6/2021 Manda .............. H01L 27/14694

OTHER PUBLICATIONS

Kim, Y. et al., "High-Sensitivity Pixels with a Quad-WRGB Color Filter and Spatial Deep-Trench Isolation" Sensors 2019, 10 pages.
U.S. Appl. No. 16/777,027, Non-Final Office Action dated Jan. 18, 2022, 16 pages.

* cited by examiner

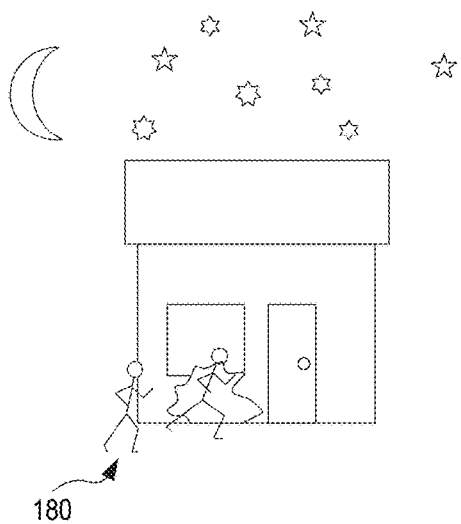
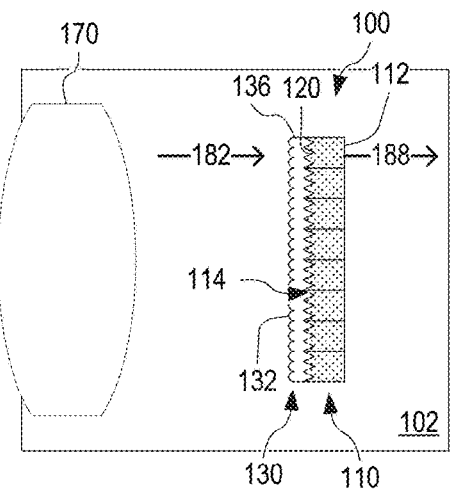
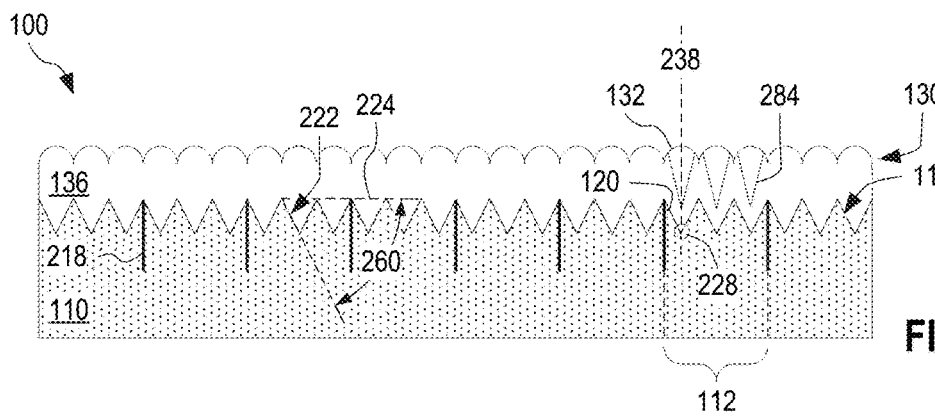
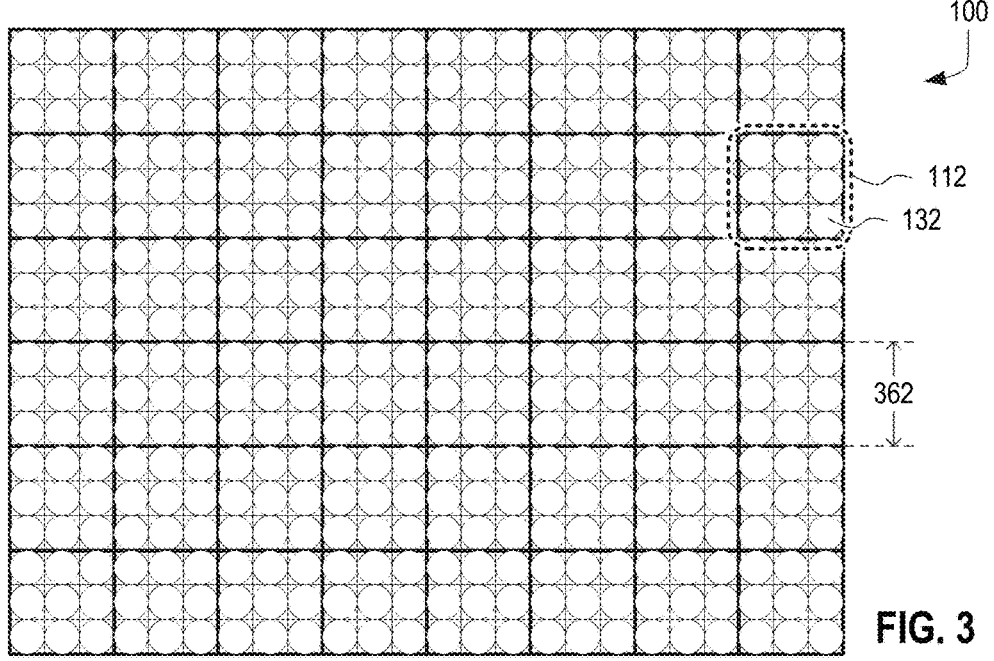
FIG. 1
FIG. 2
FIG. 3

IMAGE SENSORS WITH QUANTUM EFFICIENCY ENHANCED BY INVERTED PYRAMIDS

BACKGROUND

An image sensor, such as a charge coupled device (CCD) image sensor or a complementary metal oxide semiconductor (CMOS) image sensor, converts incident light to electrical charge. The quantum efficiency of an image sensor is the percentage of the incident photons that produce a charge carrier in the image sensor. For each pixel of an image sensor, the quantum efficiency is defined by a combination of several factors, including the efficiency with which incident light is directed to a photodiode of the pixel (i.e., the external quantum efficiency) and the efficiency with which the photodiode converts a photon to a charge carrier (i.e., the internal quantum efficiency). The quantum efficiency of an image sensor may thus depend on, e.g., the wavelength of the incident light, material properties of the image sensor, performance of a color filter incorporated in the pixel (in the case of color image sensors at least), and the geometrical relationship between the photodiode of the pixel and a microlens used to focus the incident light onto the photodiode.

An image sensor's quantum efficiency may be a critical parameter to achieve the desired performance when the image sensor is deployed in a low-light situation. One such example is night-vision cameras configured to image a scene in the infrared spectrum. A related example is day-and-night surveillance, where the same camera is used to (a) during the day, image a scene based on visible light and (b) during the night, image the same scene in the dark based on infrared light that is less efficiently converted to electrical charge in the semiconductor material of the image sensor.

SUMMARY

In an embodiment, an image sensor with quantum efficiency enhanced by inverted pyramids includes a semiconductor substrate and a plurality of microlenses. The semiconductor substrate includes an array of pixels. Each of the pixels is configured to convert light incident on the pixel to an electrical output signal, the semiconductor substrate having a top surface for receiving the light. The top surface forms a plurality of inverted pyramids in each pixel. The plurality of microlenses are disposed above the top surface and aligned to the plurality of inverted pyramids, respectively.

BRIEF DESCRIPTION OF THE DRAWINGS

FIG. 1 illustrates an image sensor with quantum efficiency enhanced by a plurality of inverted pyramids and a respective plurality of microlenses per pixel, according to an embodiment.

FIGS. 2 and 3 show the image sensor of FIG. 1 in further detail.

DESCRIPTION OF EXAMPLE EMBODIMENTS

Figure 4:
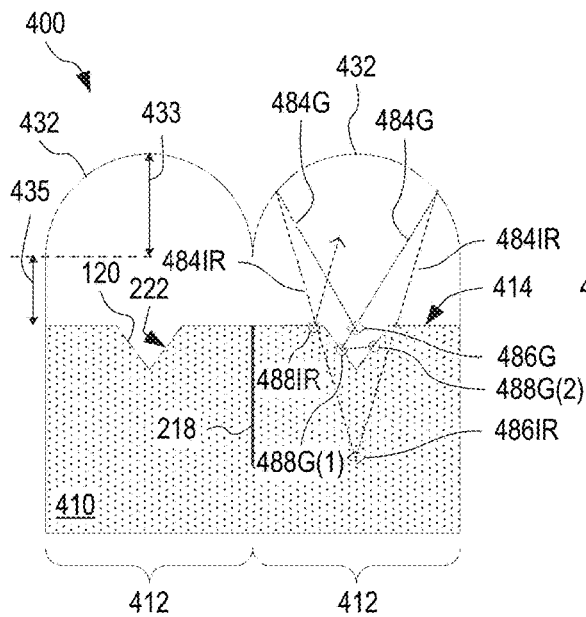
FIG. 4 shows the configuration of an image sensor that has only one inverted pyramid and one microlens per pixel.

FIG. 1 illustrates, in cross-sectional view, one image sensor 100 with quantum efficiency enhanced by a plurality of inverted pyramids and a respective plurality of microlenses, per pixel of image sensor 100. Image sensor 100 includes a semiconductor substrate 110 and a microlens array 130. Image sensor 100 may be a complementary metal oxide semiconductor (CMOS) image sensor, either frontside-illuminated or backside-illuminated. Semiconductor substrate 110 includes a plurality of pixels 112. Each pixel 112 converts light 182 incident on pixel 112 to an electrical output signal 188. Semiconductor substrate 110 has a light-receiving top surface 114 that, in each pixel 112, forms a plurality of inverted pyramids 120. Microlens array 130 is disposed over top surface 114 and includes a plurality of microlenses 132. Microlens array 130 is implemented in a light transport layer 136 disposed on top surface 114. Each microlens 132 is aligned to a respective inverted pyramid 120. Semiconductor substrate 110 may be a silicon-based substrate with doped and/or conductive regions to form pixels 112.

For each pixel 112, inverted pyramids 120 of pixel 112 cooperate with microlenses 132, disposed over inverted pyramids 120 of pixel 112, to enhance the quantum efficiency of image sensor 100. More specifically, the inverted pyramids 120 and microlenses 132 enhance the external quantum efficiency of image sensor 100. Inverted pyramids 120 reduce the amount of light 182 lost due to reflection at the surface of semiconductor substrate 110. For example, when semiconductor substrate 110 is substantially composed of silicon and light transport layer 136 has a refractive index of 1.5 (typical for polymers), the reflection coefficient for light incident on top surface 114 at normal incidence is between 16% and 18% in the near-infrared spectrum (i.e., between 700 and 1400 nanometers). It is noted that this calculation is based on geometrical optics and ignores any sub-wavelength effects that may result from, e.g., inverted pyramids 120 being of a size that is on the same order as the wavelength of the incident light. The inclusion of multiple inverted pyramids 120 and microlenses 132 per pixel 112 improves the degree to which pixel 112 benefits from the reflection loss reduction provided by inverted pyramids 120. These effects combine to enhance the external quantum efficiency of image sensor 100, as compared to either one of (a) an image sensor with only one inverted pyramid and only one microlens per pixel and (b) an image sensor with a plurality of inverted pyramids but only one microlens per pixel. In certain embodiments, the configuration of inverted pyramids 120 and microlenses 132 of image sensor 100 is optimized for quantum efficiency enhancement in the near-infrared spectrum. However, quantum efficiency enhancement may be optimized for other wavelength ranges of particular interest. In addition, it is possible to optimize the configuration of inverted pyramids 120 and microlenses 132 of image sensor 100 for quantum efficiency enhancement in the near-infrared spectrum while also achieving a good quantum efficiency in the visible spectrum.

Light transport layer 136 may include one or more wavelength filters. In one embodiment, image sensor 100 is a monochrome image sensor. In this embodiment, image sensor 100 may be optimized for imaging of near-infrared light, such as light in the 700-1000 nanometer spectral range. When a monochrome embodiment of image sensor 100 is optimized for imaging near-infrared light, light transport layer 136 may include a wavelength filter, between microlenses 132 and top surface 114, that transmits near-infrared light and at least partly blocks visible light. Alternatively, in a monochrome embodiment of image sensor 100 optimized for imaging near-infrared light, light transport layer 136 may be substantially optically clear in at least the visible and near-infrared spectral ranges. In another embodiment, image sensor 100 is a color image sensor, wherein pixels 112 include a plurality of groups of pixels 112 dedicated to detecting light of a respective plurality of colors, such as red, green, blue, and near-infrared. In this embodiment, light transport layer 136 may include a color filter array between microlenses 132 and top surface 114.

In the present disclosure, the colors red, green, and blue are frequently used as examples of a plurality of different colors. It is understood that the colors red, green, and blue may be replaced by another set of colors, such as (a) another set of three colors (e.g., red, yellow, and blue, or cyan, yellow, and magenta), or (b) a set of four colors (e.g., cyan, yellow, green, and magenta).

FIG. 1 depicts image sensor 100 in an example use scenario, wherein image sensor 100 is deployed in a camera 102 set up to image a scene 180 at night. Camera 102 is configured to capture images of a scene 180, through detection of near-infrared light from scene 180. Thus, in the depicted example use scenario, light 182 is in the near-infrared spectrum. Camera 102 includes image sensor 100 and an imaging objective 170. Imaging objective 170 may be a single lens or a composite lens system that includes a plurality of optical elements. Night imaging based on near-infrared light is typically a low-light scenario, and it may therefore be challenging to achieve sufficient image brightness with a reasonably short exposure time. In addition, the internal quantum efficiency for conversion of light to electric charge in silicon (an example of the photosensitive material of semiconductor substrate 110) drops sharply at around 1000 nanometers. Camera 102 benefits from the enhanced quantum efficiency of image sensor 100 to be capable of at least partly compensating for (a) the drop in internal quantum efficiency for light-to-charge conversion in the near-infrared spectrum for silicon-based embodiments of semiconductor substrate 110 and/or (b) a low level of near-infrared light available for imaging. In one implementation, camera 102 is a monochrome night-vision camera configured to image near-infrared light. In another implementation, camera 102 is a color camera configured to capture both color images and near-infrared images, using respective subsets of pixels 112.

FIGS. 2 and 3 show image sensor 100 in further detail. FIG. 2 is a cross-sectional side view of image sensor 100, and FIG. 3 is a top plan view of image sensor 100. FIGS. 2 and 3 are best viewed together in the following description. Without departing from the scope hereof, image sensor 100 may include fewer or more pixels 112 than shown in FIGS. 2 and 3.

In each pixel 112, top surface 114 forms N×N inverted pyramids 120, and microlens array 130 has N×N microlenses 132 disposed over each pixel 112, such that each microlens 132 is aligned to a respective inverted pyramid 120. While FIGS. 2 and 3 show an example where N=3, N may be any integer greater than one, without departing from the scope hereof. For example, each pixel 112 may have exactly 2×2 inverted pyramids 120, and microlens array 130 may have exactly 2×2 microlenses 132 disposed over each pixel 112. Each inverted pyramid 120 has sides 222 converging at an apex 228. Apex 228 is on the optical axis 238 of a corresponding microlens 132. Optionally, image sensor 100 includes deep trench isolation 218 that electrically separates each pair of adjacent pixels 112 from each other.

In one embodiment, each pixel 112 has a square cross section, in the plane of FIG. 3, with side length 362, and the number $N^2$ of inverted pyramids 120 per pixel 112 meets the condition $N < L_p/(0.8$ microns), wherein $L_p$ is side length 362. This condition allows a footprint of at least (0.8 microns)×(0.8 microns) for each microlens 132, and thereby ensures that microlenses 132 with satisfactory focusing and light collection performance can be manufactured using presently available microlens manufacturing technology.

Inverted pyramids 120 may be formed in semiconductor substrate 110 by laser interference lithography and a subsequent pattern transfer process using reactive ion etching followed by KOH etching, as outlined in Amalraj Peter Amalathas and Maan M. Alkaisi (May 2, 2018), "Fabrication and Replication of Periodic Nanopyramid Structures by Laser Interference Lithography and UV Nanoimprint Lithography for Solar Cells Applications, Micro/Nanolithography—A Heuristic Aspect on the Enduring Technology", Jagannathan Thirumalai, IntechOpen, DOI: 10.5772/intechopen.72534, available from https://www.intechopen.com/books/micro-nanolithography-a-heuristic-aspect-on-the-enduring-technology/fabricationand-replication-of-periodic-nanopyramid-structures-by-laser-interference-lithography-and, which is incorporated herein by reference in its entirety.

For the purpose of comparison, FIG. 4 shows the configuration of an image sensor 400 that has only one inverted pyramid 120 and one microlens 432 per pixel 412 of image sensor 400. For clarity of illustration, only two pixels 412 and two corresponding microlenses 432 are depicted in FIG. 4. Pixels 412 are electrically isolated from each other by deep trench isolation 218. Each microlens 432 focuses green light (indicated by rays 484G) to a focal point 486G. Focal point 486G is located approximately at the top of a top surface 414 of a semiconductor substrate 410 of image sensor 400, i.e., at the base of inverted pyramid 120. Within inverted pyramid 120, rays 484G diverge from focal point 486G to be incident on sides 222 of inverted pyramid 120. In a geometrical optics consideration, the portion of ray 484G, reflected at the first point 488G(1) of incidence on a side 222, is, due to the slanted orientation of sides 222, reflected toward a second point 488G(2) of incidence. Inverted pyramid 120 thus facilitates the existence of two points of incidence for a single ray 484G, which significantly reduces the amount of light lost due to reflection at top surface 414. For example, if the transmission coefficient into semiconductor substrate 410 for each point 488G of incidence is approximately 80%, the combined transmission coefficient for two points 488G of incidence is approximately 96%. It is noted that the actual transmission coefficient may be influenced by effects that go beyond geometrical optics when inverted pyramids 120 are of a size that is on the same order as the wavelength of the incident light.

However, microlens 432 focuses near-infrared light less tightly, such that the focal point 486IR for near-infrared light is below inverted pyramid 120 and a substantial portion of incident near-infrared light is incident on a planar portion of top surface 414 outside inverted pyramid 120, as indicated by ray 484IR partly reflected at point 488IR of incidence. The reflected portion of ray 484IR is lost. As a result, near-infrared light benefits less from inverted pyramid 120 than green light (and other visible light).

Figure 5:
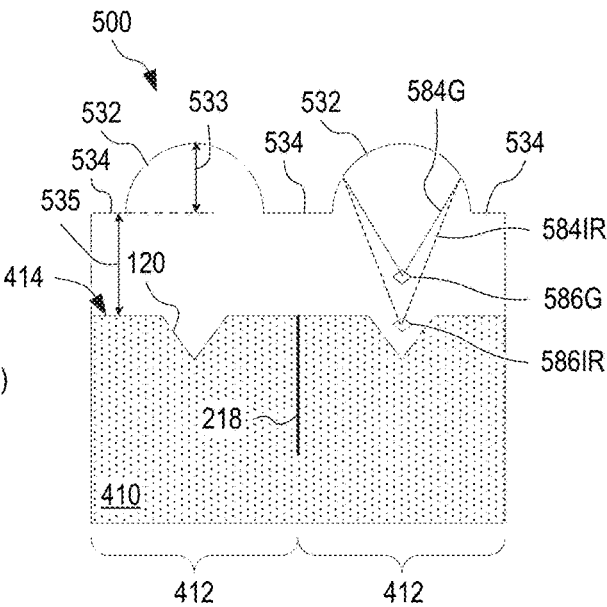
FIG. 5 shows the configuration of another image sensor having only one inverted pyramid and one microlens per pixel, but wherein microlenses have been shrunk to more tightly focus near-infrared light.

FIG. 5 shows the configuration of another image sensor 500 having only one inverted pyramid 120 and one microlens 532 per pixel 512 of image sensor 500, but wherein microlenses 532 have been shrunk (relative to microlenses 432) to more tightly focus near-infrared light. Microlens 432 is a spherical lens with radius of curvature 433. Microlens 532 is a spherical lens with radius of curvature 533. Herein, a "spherical lens" refers to a lens characterized by its lens surface being a truncated sphere. Radius of curvature 533 is less than radius of curvature 433 by an amount Δ. The distance 535 from the base of microlens 532 to the top of top surface 414 in image sensor 500 is greater than the distance 435 from the base of microlens 432 to the top of top surface 414 in image sensor 400 by the amount Δ. Radius of curvature 533 and distance 535 cooperate to place a focal point 586IR of near-infrared light at the base of inverted pyramid in image sensor 500, to avoid the reflection loss experienced by near-infrared rays 484IR in image sensor 400. Microlens 532 thus couples near-infrared light (indicated by rays 584IR) to inverted pyramid 120. The focal point 586G of green light (indicated by rays 584G) is above the base of inverted pyramid 120, such that green light is also coupled to inverted pyramid 120. Thus, image sensor 500 reduces the reflection loss at top surface 414 for both near-infrared light and green light. However, the lesser size of microlenses 532 results in the so-called fill factor of microlenses 532 being less than 100%. Planar, non-focusing surfaces 534 exist between microlenses 532, which leads to a reduction in light collection efficiency by the array of microlenses 532 in image sensor 500. This loss in light collection efficiency, caused by the less-than-unity fill factor of microlenses 532, at least partly counteracts the reduction in reflection loss provided by tighter focusing of microlenses 532.

Figure 6:
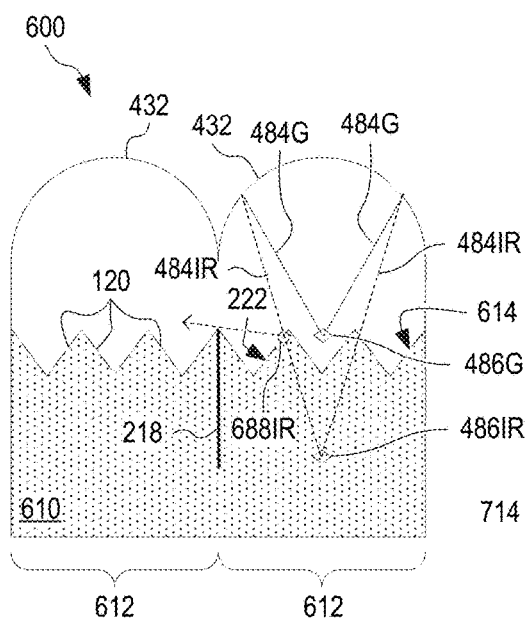
FIG. 6 shows the configuration of an image sensor having a plurality of inverted pyramids but only one microlens per pixel.

FIG. 6 shows the configuration of an image sensor 600 having a plurality of inverted pyramids 120 but only one microlens 432 per pixel 612 of image sensor 600. Image sensor 600 is the same as image sensor 400 apart from each pixel 612 of image sensor 600 forming 3×3 inverted pyramids 120 instead of only a single central inverted pyramid 120, such that a top surface 614 of the semiconductor substrate 610 of image sensor 600 is entirely composed of inverted pyramids 120 (at least within pixels 612). Although all light rays, e.g., green rays 484G and near-infrared rays 484IR, are therefore coupled to inverted pyramids 120, we have found that the additional inverted pyramids 120 in image sensor 600 do not lead to an improvement in quantum efficiency over image sensor 400. Without being bound by theory, we hypothesize that this may be at least partly due to an unfavorable orientation of sides 222 of non-central inverted pyramids nearest the central inverted pyramid 120. For example, in a geometrical optics consideration, a ray 484IR incident on such a side 222 at a point 688IR of incidence is partly reflected out of this inverted pyramid 120 and therefore does not benefit from a second point of incidence.

Referring again to FIGS. 2 and 3, image sensor 100 outperforms each of image sensors 400, 500, and 600. Microlens array 130 has a fill factor of 100%, and each microlens 132 is aligned to a respective inverted pyramid 120 to benefit from optimal coupling of light into semiconductor substrate 110 via the respective inverted pyramid 120. In other words, image sensor 100 combines the inverted-pyramid-based quantum efficiency enhancement of image sensor 400 with the near-infrared quantum efficiency enhancement provided by the smaller microlenses 532 of image sensor 500, without suffering the drawbacks of the less-than-unity fill factor of microlenses 532. In addition, the higher periodicity of inverted pyramids 120, resulting from each pixel 112 including a plurality of inverted pyramids 120, increases the angle of petal flare caused by inverted pyramids 120. This effect reduces the petal flare signal detected by image sensor 100.

Herein, a fill factor of 100% refers to a microlens array that does not have a gap between adjacent microlenses. It is understood, however, that deviations from the desired lens surface profiles may exist at the boundary between adjacent microlenses, such that only, e.g., 95-99% of the microlens array area is fully functional.

In an embodiment, each inverted pyramid 120 is formed from four sides 222. Alternatively, each inverted pyramid 120 may be formed from a different number of sides 222, such as three or six. However, embodiments with four sides 222 has certain advantages: (1) In embodiments of image sensor 100 where semiconductor substrate 110 is a silicon substrate, a germanium substrate, a silicon-germanium substrate, or an indium gallium arsenide substrate, sides 222 may be along {111} crystal planes of semiconductor substrate 110, which makes it possible to achieve a high-quality finish of sides 222 that minimizes dark current and can be inexpensively and reliably manufactured, and (2) dead space between inverted pyramids 120 may be minimized or eliminated, which is preferable in some embodiments of image sensor 100.

Sides 222 are oriented at an angle $\theta_b$ (labeled 260 in FIG. 2) to the base 224 of inverted pyramids 120. In one embodiment, semiconductor substrate 110 is a silicon substrate, a germanium substrate, a silicon-germanium substrate, or an indium gallium arsenide substrate, and $\theta_b$=54.7° such that sides 222 are along {111} crystal planes of semiconductor substrate 110. In this embodiment, sides 222 are at an angle of 35.3° to optical axes 238 of microlenses 132. More generally, when not fixing sides 222 to {111} crystal planes, $\theta_b$ may be in the range between 30° and 70°, corresponding to the angle between sides 222 and optical axes 238 being in the range between 20° and 60°.

In the example depicted in FIG. 2, inverted pyramids 120 occupy all of top surface 114 over pixels 112. Without departing from the scope hereof, and as discussed in further detail below in reference to FIGS. 9-11, adjacent inverted pyramids 120 may be separated from each other by a planar portion of top surface 114.

Figure 7:
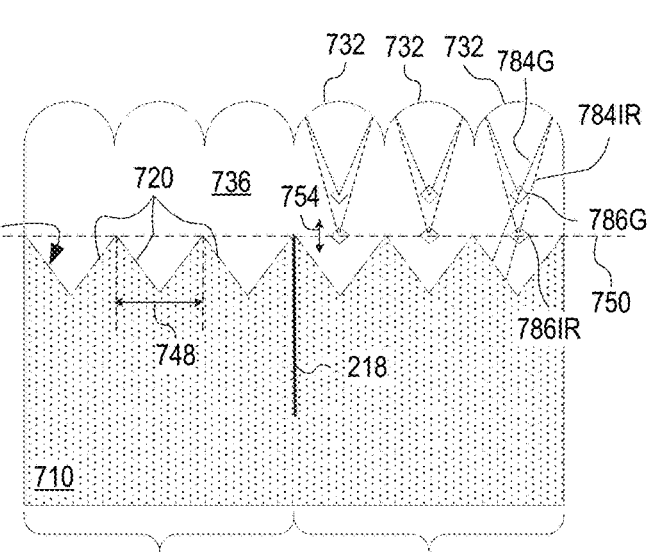
FIG. 7 illustrates a near-infrared-optimized image sensor having a plurality of inverted pyramids and a respective plurality of microlenses per pixel, according to an embodiment.

FIG. 7 illustrates the configuration of one near-infrared-optimized image sensor 700 having a plurality of inverted pyramids 720 and a respective plurality of microlenses 732 per pixel. Image sensor 700 is an embodiment of image sensor 100. Image sensor 700 includes a semiconductor substrate 710 including pixels 712 and having a top surface 714 forming inverted pyramids 720. Image sensor 700 further includes a light transport layer 736 that includes microlenses 732. Semiconductor substrate 710, pixels 712, top surface 714, inverted pyramids 720, light transport layer 736, and microlenses 732, are embodiments of semiconductor substrate 110, pixels 112, top surface 114, inverted pyramids 120, light transport layer 136, and microlenses 132, respectively. In the example depicted in FIG. 7, image sensor 700 has 3×3 inverted pyramids 720 and 3×3 microlenses 732 per pixel 712. More generally, image sensor 700 may have N×N inverted pyramids 720 and N×N microlenses 732 per pixel 712, wherein N is an integer greater than one.

As indicated by near-infrared rays 78418 and near-infrared focal point 786IR, each microlens 732 focuses near-infrared light to a planar upper boundary 750 of top surface 714, i.e., to the base of the corresponding inverted pyramid 720, such that near-infrared light is incident on semiconductor substrate 710 inside inverted pyramids 720 and therefore benefits from quantum efficiency enhancement provided by inverted pyramids 720. Light of shorter wavelengths is focused above planar upper boundary 750, as indicated by green rays 784G and green focal point 786G. Even though visible light is focused above planar upper boundary 750, the vast majority of visible light focused by one microlens 732 is incident on top surface 714 within the corresponding inverted pyramid 720 (for example as indicated by green rays 784G). Image sensor 700 therefore optimizes the quantum efficiency for near-infrared light while also achieving a good quantum efficiency for visible light. Without departing from the scope hereof, near-infrared focal point 786IR may be offset from planar upper boundary 750 by a small amount. For example, near-infrared focal point 786IR may be within range 754 of planar upper boundary 750 that is no more than 0.1 microns above or below planar upper boundary 750.

Figure 8:
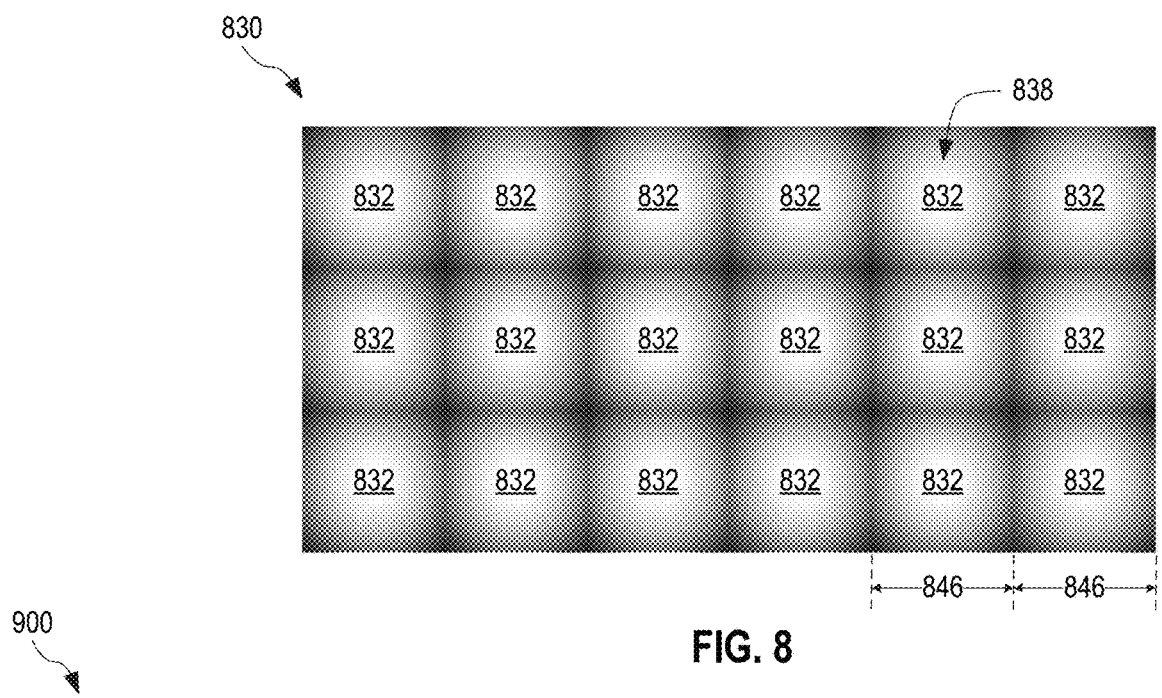
FIG. 8 is a top plan view of a microlens array with 100% fill factor, according to an embodiment.

FIG. 8 is a top plan view of one microlens array 830 with 100% fill factor. Microlens array 830 is an embodiment of microlens array 130. Each microlens 832 has a square footprint with side length 846, and there is no dead space between adjacent microlenses 832. In one embodiment, side length 846 is at least 0.8 microns to ensure that microlenses 832 with satisfactory focusing and light collection performance can be manufactured using presently available microlens manufacturing technology, as discussed above in reference to FIGS. 2 and 3. The light receiving lens surface 838 of each microlens 832 may be substantially spherical. Lens surfaces 838 of adjacent microlenses 832 have no gaps therebetween in dimensions orthogonal to optical axes of the microlenses.

Referring again to FIG. 7, image sensor 700 may implement microlenses 732 as microlens array 830. In this implementation, top surface 714 may be entirely composed of inverted pyramids 720 over pixels 712, such that each inverted pyramid 720 has a square cross section with side length 748 that equals side length 846.

Figure 9:
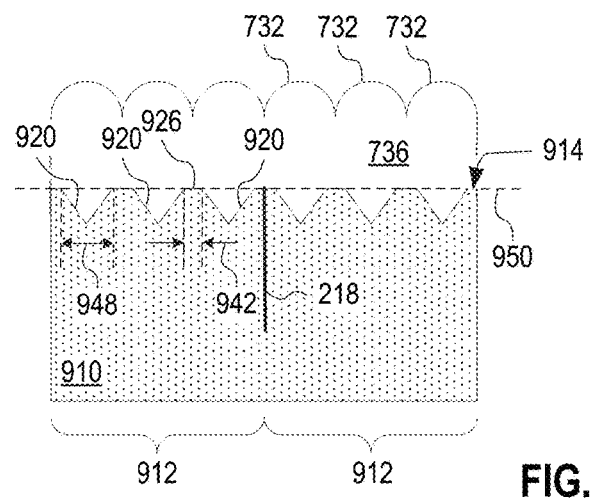
FIG. 9 illustrates a near-infrared-optimized image sensor having a plurality of inverted pyramids and a respective plurality of microlenses per pixel, wherein each inverted pyramid is surrounded by a planar surface, according to an embodiment.

FIG. 9 illustrates the configuration of one near-infrared-optimized image sensor 900 having a plurality of inverted pyramids 920 and a respective plurality of microlenses 732 per pixel, wherein each inverted pyramid 920 is surrounded by a planar surface 926. Image sensor 900 is a modification of image sensor 700, wherein semiconductor substrate 710 is replaced by a semiconductor substrate 910. Semiconductor substrate 910 is similar to semiconductor substrate 710, except that the top surface 914 of semiconductor substrate 910, over pixels 912 of semiconductor substrate 910, is composed of inverted pyramids 920 and planar surface 926. Planar surface 926 coincides with a planar upper boundary 950 of top surface 914, such that planar surface 926 is coplanar with the bases of inverted pyramids 920. Each pair of adjacent inverted pyramids 920 are separated from each other by a portion of planar surface 926 having non-zero extent 942. Each inverted pyramid 920 is a four-sided inverted pyramid with a square footprint characterized by a side length 948. Image sensor 900 may implement microlens array 830. In this implementation, side length 948 is less than side length 846.

Figure 10:
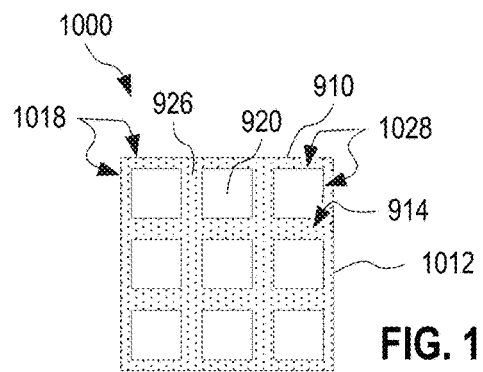
FIG. 10 is a top view of a pixel of one example of the semiconductor substrate of FIG. 9.

FIG. 10 is a top view of a pixel 1012 of one semiconductor substrate 1000 that is an embodiment of semiconductor substrate 910. Semiconductor substrate 1000 arranges inverted pyramids 920 such that sides 1028 of the square footprint of inverted pyramids 920 are parallel to sides 1018 of pixel 1012.

Figure 11:
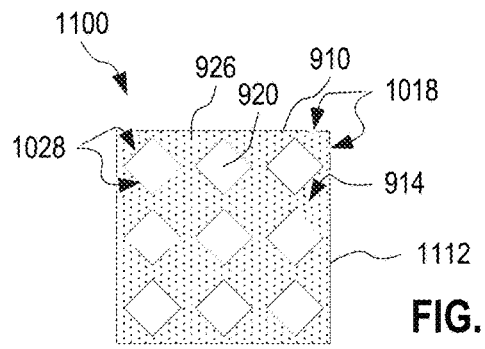
FIG. 11 is a top view of a pixel of another example of the semiconductor substrate of FIG. 9.

FIG. 11 is a top view of a pixel 1112 of another semiconductor substrate 1100 that is an embodiment of semiconductor substrate 910. Semiconductor substrate 1100 is similar to semiconductor substrate 1000 except for arranging inverted pyramids 920 such that sides 1028 of the square footprint of inverted pyramids 920 are not parallel to sides 1018 of pixel 1112. In the example depicted in FIG. 11, sides 1028 are at 45° to sides 1018.

Figure 12:
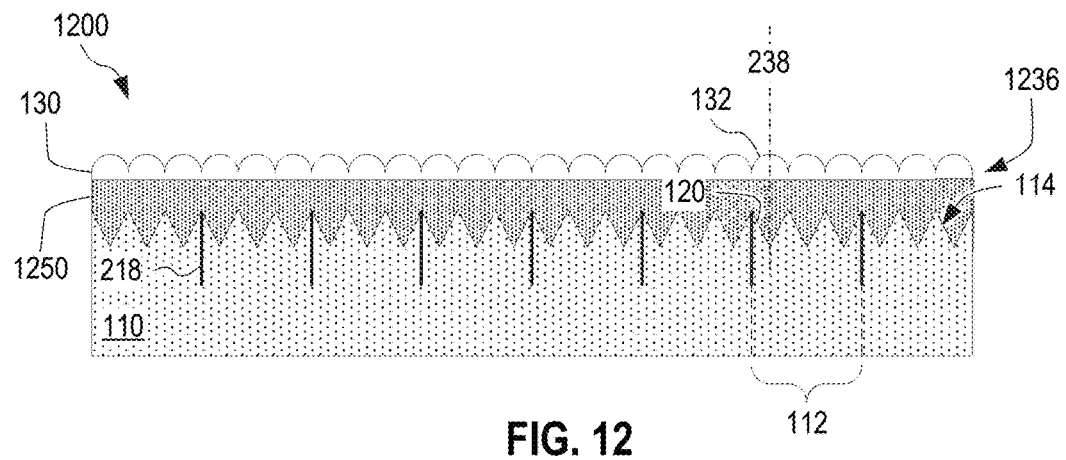
FIGS. 12 and 13 illustrate a color image sensor with quantum efficiency enhanced by a plurality of inverted pyramids and a respective plurality of microlenses per pixel, according to an embodiment.
Figure 13:
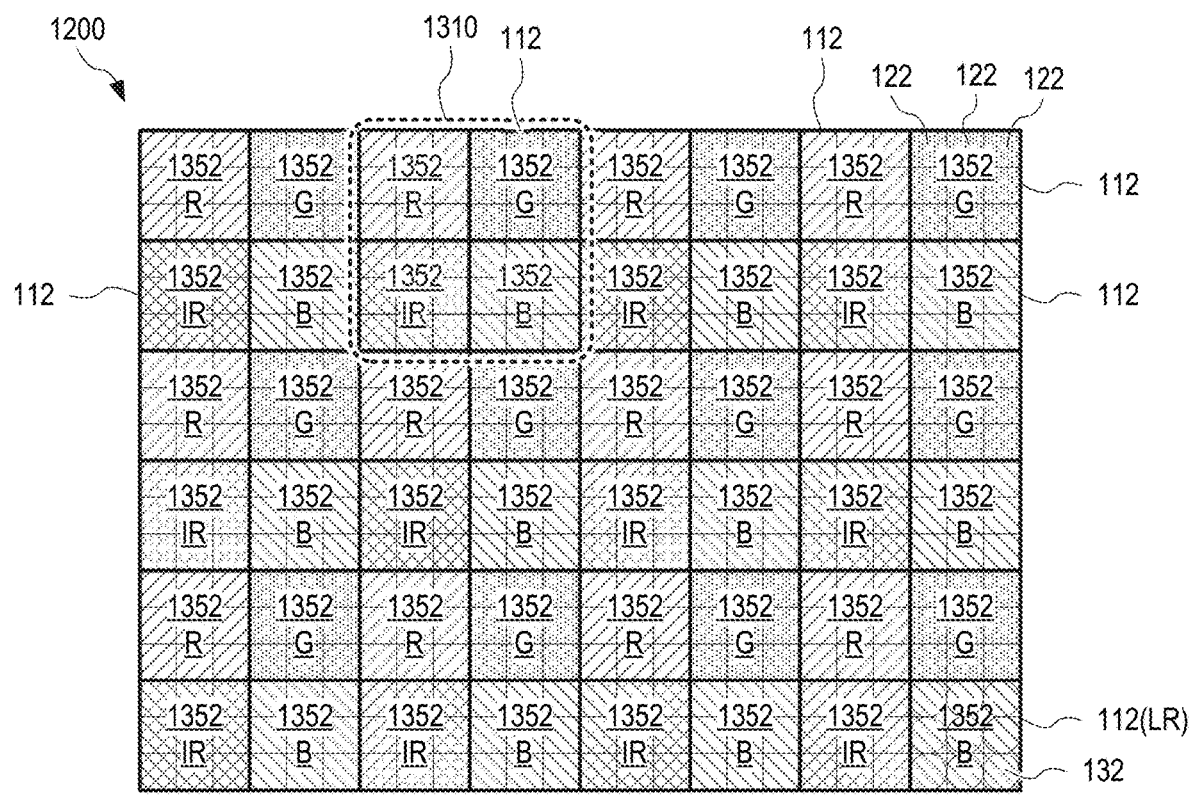

FIGS. 12 and 13 illustrate, in cross-sectional view and top plan view, respectively, one color image sensor 1200 with quantum efficiency enhanced by a plurality of inverted pyramids 120 and a respective plurality of microlenses 132 per pixel. For clarity of illustration, certain elements are omitted from the top view in FIG. 13. For example, microlenses 132 are shown only for the lower righthand pixel 112(LR) in FIG. 13. FIGS. 12 and 13 are best viewed together in the following description. Image sensor 1200 is an embodiment of image sensor 100 that implements light-transport layer 136 as a wavelength-filtering light transport layer 1236. Light transport layer 1236 includes microlens array 130 and color filter array 1250 disposed between top surface 114 and microlens array 130. Color filter array 1250 spectrally filters light propagating from microlens array 130 to semiconductor substrate 110. Each pixel 112 of color image sensor 1300 has a color filter, of color filter array 1250, disposed thereon. These color filters are arranged in identical color filter groups 1310. Each color filter group 1310 has 2×2 color filters disposed over 2×2 pixels 112.

Each color filter group 1310 includes color filters 1352R, 1352G, 1352B, and 1352IR that predominantly transmit red, green, blue, and near-infrared light, respectively.

Figure 14:
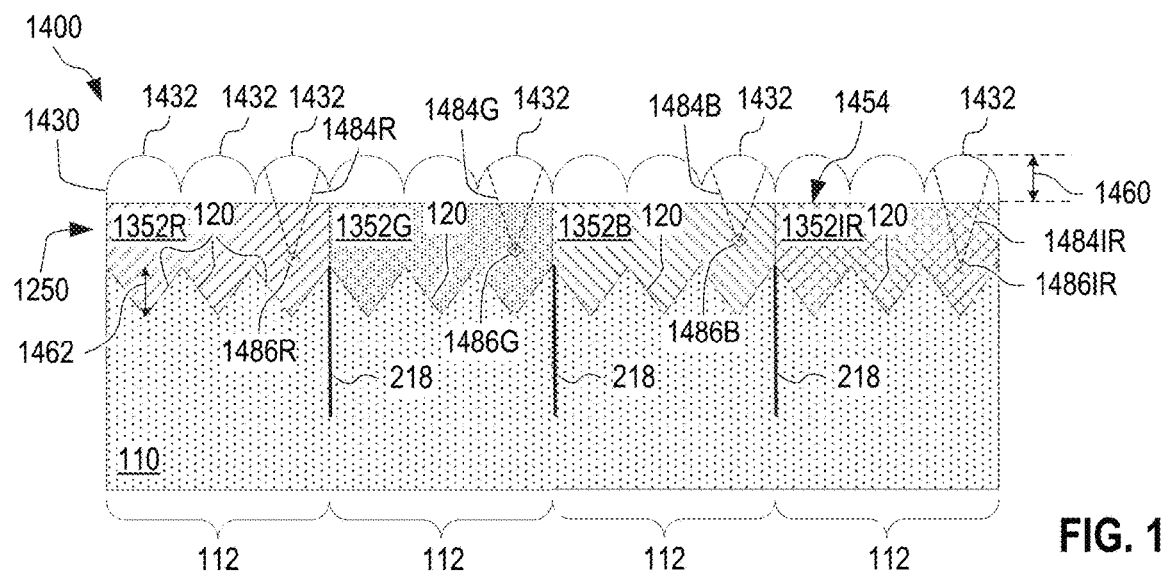
FIG. 14 illustrates a color image sensor with quantum efficiency enhanced by a plurality of inverted pyramids and a respective plurality of microlenses per pixel, wherein the microlenses are identical for all pixels, according to an embodiment.

FIG. 14 illustrates one color image sensor 1400 with quantum efficiency enhanced by a plurality of inverted pyramids 120 and a respective plurality of microlenses 1432 per pixel, wherein microlenses 1432 are identical for all pixels 112 of color image sensor 1400. Color image sensor 1400 is an embodiment of color image sensor 1200 that implements microlens array 130 as a uniform microlens array 1430 composed on identical microlenses 1432 formed on a planar surface 1454 of color filter array 1250. FIG. 14 shows only four pixels 112 of color image sensor 1400, one for detection of each of red, green, blue, and near-infrared light. For illustrative purposes, FIG. 14 shows these four pixels 112 being arranged along a straight line, although it is understood that these four pixels may not be arranged along a straight line in image sensor 1400.

The focal length of microlens 1432 is an increasing function of wavelength. Color image sensor 1400 is configured such that the focal point 1486IR for near-infrared light (as indicated by near-infrared rays 1484IR) is at the base of inverted pyramids 120, or at least within range 754 thereof as discussed above in reference to FIG. 7. Focal points 1486R, 1486G, and 1486B for red, green, and blue light, respectively, are above the base of inverted pyramids 120 by increasing amounts. As discussed above in reference to FIG. 7, this configuration optimizes the quantum efficiency enhancement for near-infrared light while also achieving a good quantum efficiency for visible light.

Figure 15:
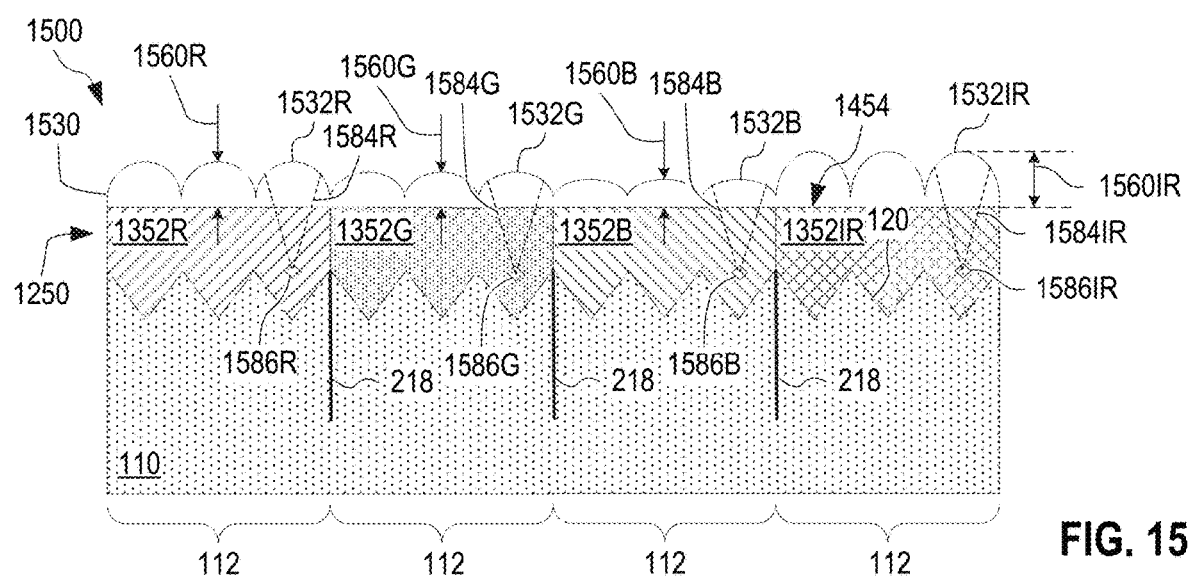
FIG. 15 illustrates another color image sensor with quantum efficiency enhanced by a plurality of inverted pyramids and a respective plurality of microlenses per pixel, wherein the microlenses are tailored to optimize the quantum efficiency enhancement for each color independently, according to an embodiment.

FIG. 15 illustrates another color image sensor 1500 with quantum efficiency enhanced by a plurality of inverted pyramids 120 and a respective plurality of microlenses 1532 per pixel, wherein microlenses 1532 are tailored to optimize the quantum efficiency enhancement of image sensor 1500 for each color independently. Color image sensor 1500 is similar to color image sensor 1400 expect for microlens array 1430 being replaced by a microlens array 1530. Microlens array 1530 includes microlenses 1532R, 1532G, 1532B, and 1532IR, such that each red color filter 1352R has microlenses 1532R disposed thereon, each green color filter 1352G has microlenses 1532G disposed thereon, each blue color filter 1352B has microlenses 1532B disposed thereon, and each near-infrared color filter 1352IR has microlenses 1532IR disposed thereon. In an embodiment, the fill factor of microlens array 1530 is 100%.

The focal length of microlenses 1532B for blue light 1584B is less than the focal length of microlenses 1532G for green light 1584G, the focal length of microlenses 1532G for green light 1584G is less than the focal length of microlenses 1532R for red light 1584R, and the focal length of microlenses 1532R for red light 1584R is less than the focal length of microlenses 1532IR for near-infrared light 1584IR. Microlenses 1532R, 1532G, 1532B, and 1532IR are configured such that focal points 1586R, 1586G, 1586B, and 1586IR for red, green, blue, and near-infrared light, respectively, are all at the base of inverted pyramids 120 (or at least within range 754 thereof as discussed above in reference to FIG. 7). Microlenses 1532R, 1532G, 1532B, and 1532IR have different respective heights 1560R, 1560G, 1560B, 1560IR, relative to planar surface 1454, so as to achieve the focal length differences required to place each of focal points 1586R, 1586G, 1586B, and 1586IR at or near the base of inverted pyramids 120. Height 1560B is less than height 1560G, height 1560G is less than height 1560R, and height 1560R is less than height 1560IR.

Without departing from the scope hereof, the color-specific optimization of microlens height in image sensor 1500 may be applied to a similar color image sensor having only a single microlens and a single inverted pyramid per pixel.

In an embodiment alternative to color image sensor 1500, microlenses 1532 are identical for all pixels 112, and color-specific quantum efficiency enhancement is instead achieved by using deeper pyramids 120 in pixels 112 configured to image longer-wavelength light and shallower pyramids 120 in pixels 112 configured to image shorter-wavelength light. While this configuration does not place the focus all colors to the base of pyramids 120, the depth of pyramids 120 may be set to at least ensure that the focal point is within pyramid 120 for all colors. In one implementation, pyramids 120 under infrared color filters 1352IR are deeper than pyramids 120 under visible color filters 1352R, 1352G, and 1352B. In this implementation, pyramids 120 under color filters green 1352G may be deeper than pyramids 120 under color filters blue 1352B and shallower than pyramids 120 under red color filters 1352R. In color image sensors utilizing pyramids 120 of different depths to achieve color-specific quantum efficiency enhancement, pyramids 120 may (a) all have same width (corresponding to width 748 of FIG. 7), but implement different color-specific width-to-depth ratios (corresponding to different angles 260), or (b) all have same width-to-depth ratios, but implement different color-specific widths.

Figure 16:
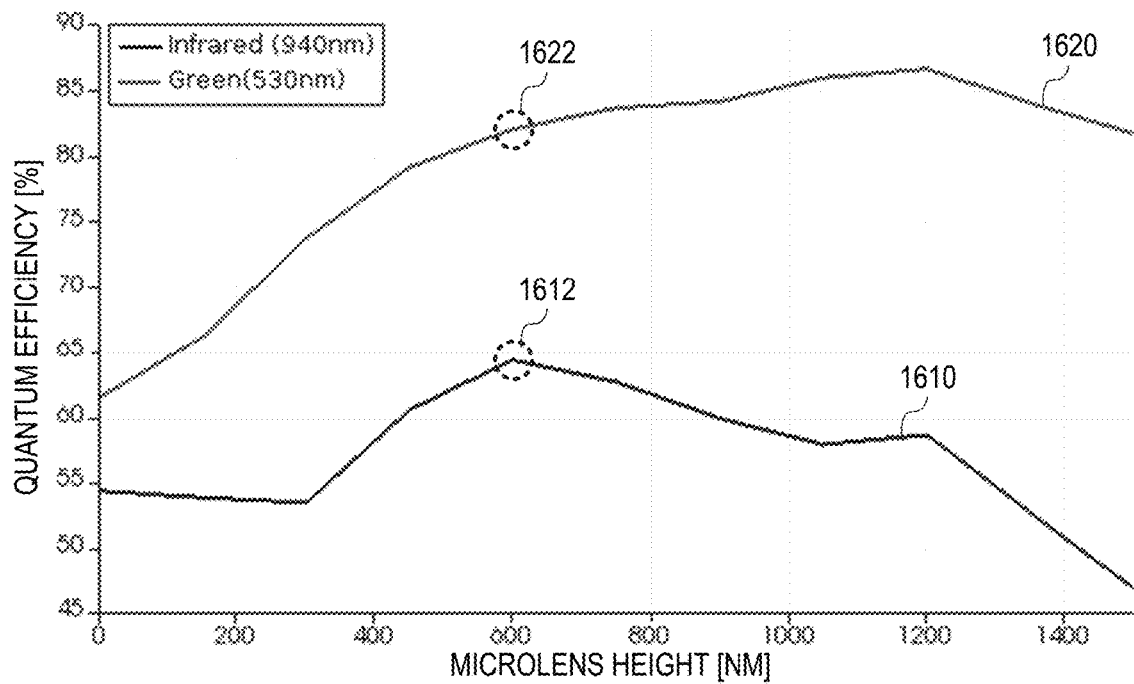
FIG. 16 is a plot of the quantum efficiency of an example of the image sensor of FIG. 14 for different microlens heights, for near-infrared light and for green light.
Figure 17:
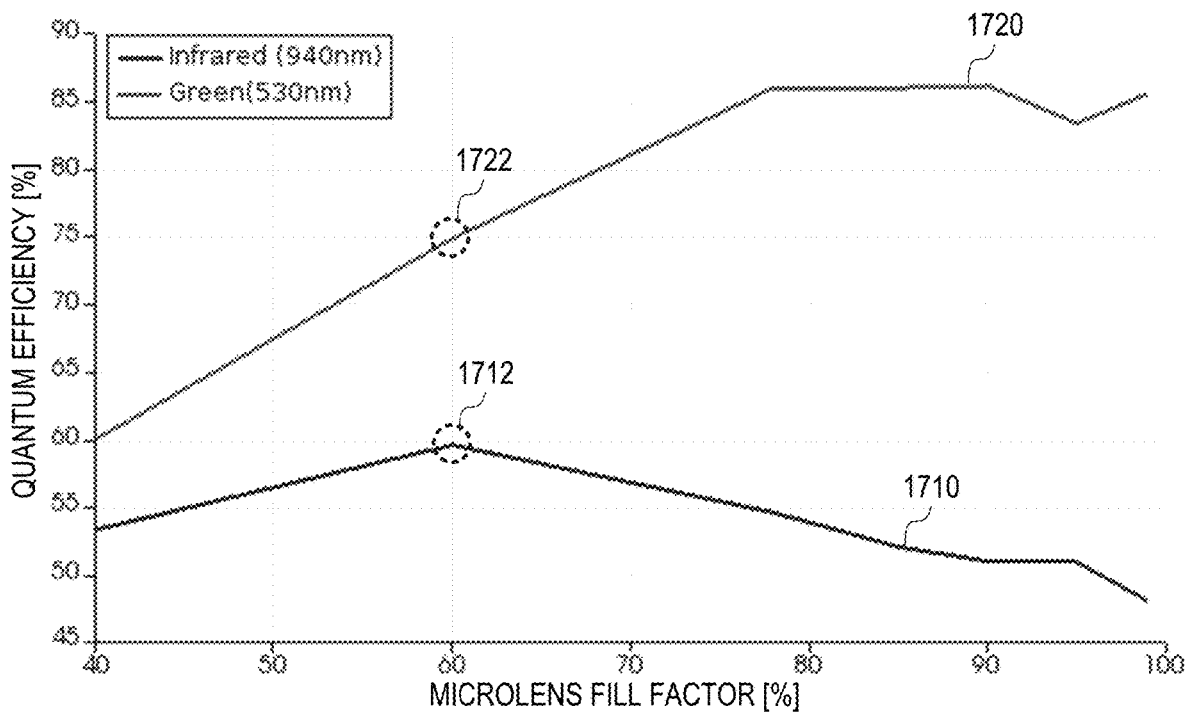
FIG. 17 plots the quantum efficiency of an example of the image sensor of FIG. 5 for different fill factors of the microlenses, for near-infrared light and for green light.

FIG. 16 is a plot of the quantum efficiency of an example of image sensor 1400 for different heights 1460 of microlenses 1432, for near-infrared light at a wavelength of 940 nanometers (curve 1610) and for green light at a wavelength of 530 nanometers (curve 1620). In this example, each pixel 112 had a 2.2 microns×2.2 microns footprint with 2×2 inverted pyramids 120, and microlens array 1430 thus had 2×2 microlenses 1432 disposed over each pixel 112. Depth 1462 is measured from the base to the apex of inverted pyramid 120. Microlens array 1430 had a fill factor of 100%, in a manner similar to microlens array 830 of FIG. 8, with side length 846 being 1.1 microns. Each inverted pyramid 120 had a depth 1462 of 0.6 microns and a square footprint with an 0.88 micron side length. For comparison, FIG. 17 plots the quantum efficiency of an example of image sensor 500 for different fill factors of microlenses 532, for near-infrared light at a wavelength of 940 nanometers (curve 1710) and for green light at a wavelength of 530 nanometers (curve 1720). In this example, each pixel 412 had a 2.2 microns×2.2 microns footprint. The quantum efficiencies plotted in FIGS. 16 and 17 were simulated using the finite-difference time-domain method. FIGS. 16 and 17 are best viewed together in the following description.

It is evident from FIG. 16 that, for the present example of image sensor 1400, the optimal height 1460 for 940-nanometer light is 0.6 microns, where the quantum efficiency for 940-nanometer light is 64% (see point 1612). At this height, the quantum efficiency for 530-nanometer light is 82% (see point 1622). In the case of the present example of image sensor 500, FIG. 17 shows that the optimal fill factor for 940-nanometer light is 60%, where the quantum efficiency for 940-nanometer light is 60% (see point 1712). At this same fill factor, the quantum efficiency for 530-nanometer light is 75% (see point 1722). Thus, in the present examples, the near-infrared-optimized version of image sensor 1400 (with a microlens height 1460 of 0.6 microns) outperforms the near-infrared-optimized version of image sensor 500 (with a fill factor of 60%) for both 940-nanometer light and 530-nanometer light.

Figure 18:
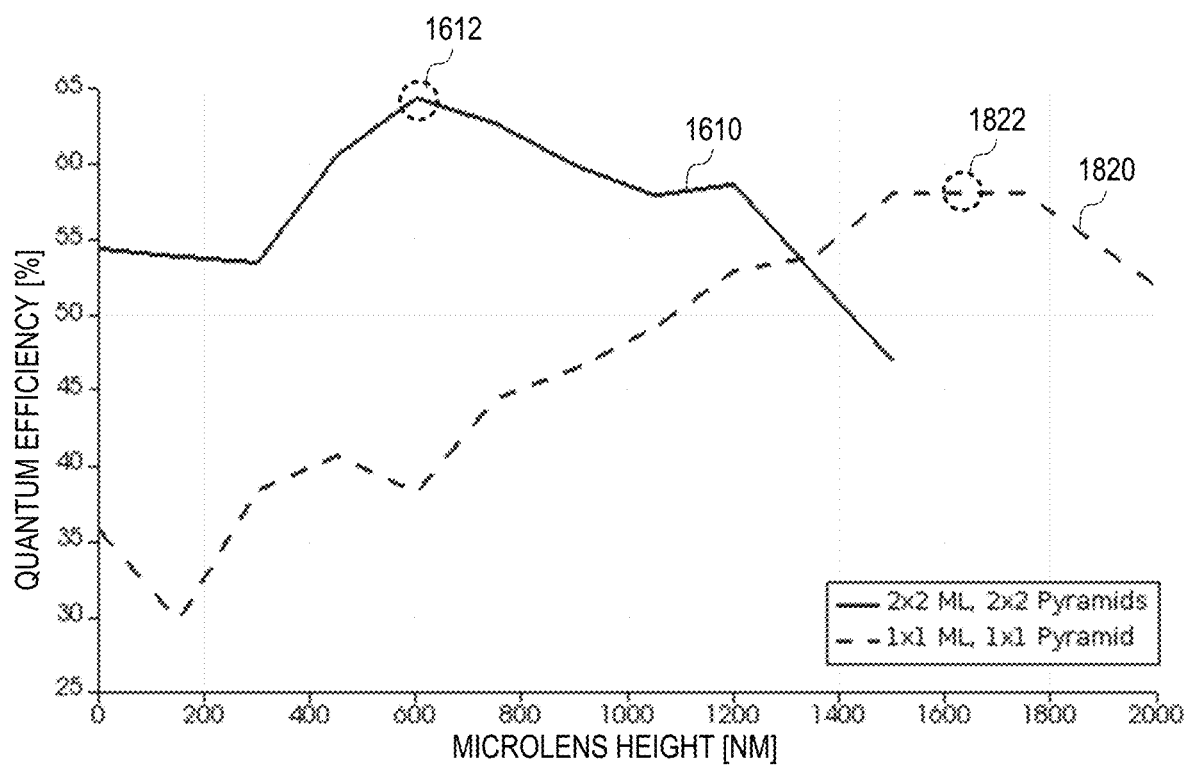
FIG. 18 compares the near-infrared results of FIG. 16 with near-infrared quantum efficiencies for an example of the image sensor of FIG. 4.

FIG. 18 compares the 940-nanometer results of FIG. 16 with finite-difference time-domain simulated quantum efficiencies, at 940 nanometers, for an example of image sensor 400 having a microlens fill factor of 100% and a 2.2 microns×2.2 microns pixel size (curve 1820). The 64% quantum efficiency achieved at point 1612 of curve 1610 is a clear improvement over the best quantum efficiency that can be achieved with image sensor 400 (see point 1822).

Figure 19:
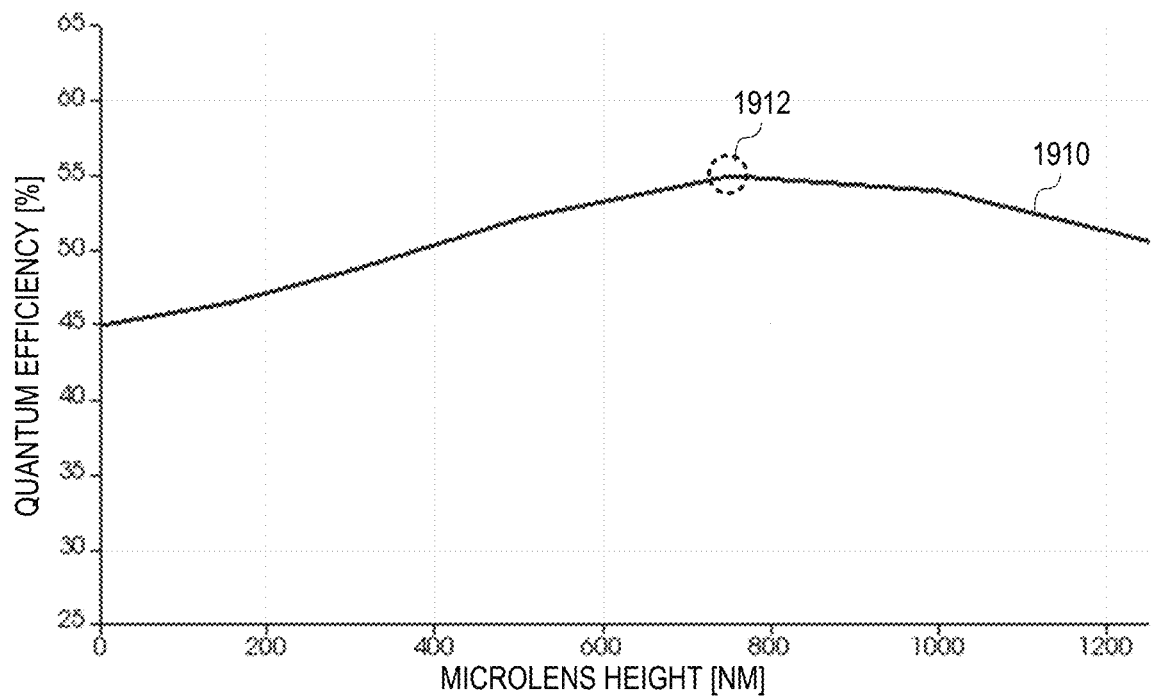
FIG. 19 plots the near-infrared quantum efficiency, as a function of distance between the microlens and the semiconductor substrate, of an example of the image sensor of FIG. 4.

FIG. 19 plots the quantum efficiency, at 940 nanometers and as a function of distance 435, of an example of image sensor 400 having a microlens fill factor of 100% and a 2.2 microns×2.2 microns pixel size (curve 1910). The quantum efficiencies plotted in FIG. 19 were obtained from a finite-difference time-domain simulation. The intention of FIG. 19 was to explore raising the focal point 486IR by increasing distance 435. The optimal value of distance 435 was found to be approximately 750 nanometers. However, the achieved quantum efficiency was only 55% (see point 1912) which is significantly less than that achieved at point 1612 in FIG. 16.

Combinations of Features

Features described above as well as those claimed below may be combined in various ways without departing from the scope hereof. For example, it will be appreciated that aspects of one image sensor, described herein, may incorporate features or swap features of another image sensor described herein. The following examples illustrate some possible, non-limiting combinations of embodiments described above. It should be clear that many other changes and modifications may be made to the methods, products, and systems herein without departing from the spirit and scope of this invention:

(A1) One image sensor with quantum efficiency enhanced by inverted pyramids includes a semiconductor substrate and a plurality of microlenses. The semiconductor substrate includes an array of pixels. Each of the pixels is configured to convert light incident on the pixel to an electrical output signal, the semiconductor substrate having a top surface for receiving the light. The top surface forms a plurality of inverted pyramids in each pixel. The plurality of microlenses are disposed above the top surface and aligned to the plurality of inverted pyramids, respectively.

(A2) In the image sensor denoted as (A2), each of microlenses may have a lens surface, and, for each pixel, the lens surfaces of the microlenses disposed over the pixel may have no gaps therebetween in dimension orthogonal to optical axes of the microlenses.

(A3) In either of the image sensors denoted as (A1) and (A2), each of the pixels may have a 2×2 or 3×3 array of the inverted pyramids.

(A4) In any of the image sensor denoted as (A1) through (A3), each of the pixels may have a square cross section in a plane orthogonal to optical axes of the microlenses, wherein the square cross section has side length $L_p$, each of the pixels have exactly N×N of the inverted pyramids, and $N < L_p/(0.8 \text{ microns})$.

(A5) In any of the image sensors denoted as (A1) through (A4), an apex of each inverted pyramid may coincide with an optical axis of a respective one of the microlenses.

(A6) In any of the image sensors denoted as (A1) through (A5), each microlens may be configured such that a focal point for green light is above a base of the inverted pyramid and a focal point for near-infrared light is in the inverted pyramid.

(A7) In any of the image sensors denoted as (A1) through (A5), each microlens may be configured such that a focal point for green light is above a base of the inverted pyramid and a focal point for near-infrared light is within 0.1 microns of the base.

(A8) Any of the image sensors denoted as (A1) through (A7) may further include a color filter array disposed between the semiconductor substrate and the microlenses, wherein each color filter of the color filter array covers a respective one of the pixels, and wherein the color filter array includes (a) a set of near-infrared filters transmissive to near-infrared light and (b) first, second, and third sets of visible color filters transmissive to respective first, second, and third colors of visible light, and wherein wavelength of the second color is shorter than wavelength of the third color and longer than wavelength of the first color.

(A9) In the image sensor denoted as (A8), the color filter array may form a planar upper surface supporting the microlenses, wherein each of the microlenses is disposed above one of the near-infrared filters having a height, from the planar upper surface, that exceeds height, from the planar upper surface, of each of the microlenses disposed above one of the visible color filters.

(A10) In the image sensor denoted as (A9), each of the microlenses may be disposed above one of the visible color filters in the second set having a height, from the planar upper surface, that (i) exceeds height, from the planar upper surface, of each of the microlenses disposed above one of the visible color filters in the first set and (ii) is exceeded by height, from the planar upper surface, of each of the microlenses disposed above one of the visible color filters in the third set.

(A11) In the image sensor denoted as (A8), the color filter array may form a planar upper surface supporting the microlenses, wherein each of the inverted pyramids is positioned below one of the near-infrared filters having a depth that exceeds depth of each of the inverted pyramids positioned below one of the visible color filters.

(A12) In the image sensor denoted as (A9), each of the inverted pyramids positioned below one of the visible color filters in the second set may have a depth that (i) exceeds depth of each of the inverted pyramids positioned below one of the visible color filters in the first set and (ii) is exceeded by depth of each of the inverted pyramids positioned below one of the visible color filters in the third set.

(A13) In any of the image sensors denoted as (A1) through (A12), each inverted pyramid may have four sides arranged along {111} crystal planes of the semiconductor substrate.

(A14) In any of the image sensors denoted as (A1) through (A13), sides of the inverted pyramids may be at an angle, to optical axes of the microlenses, that is between 20 and 60 degrees.

(A15) In any of the image sensors denoted as (A1) through (A14), each of the microlenses may have a first extent transverse to its optical axis, and each of the inverted pyramids may have a second extent, in dimensions orthogonal to the optical axis of the respective microlens, that is less than the first extent, such that bases of the inverted pyramids are at a planar portion of the top surface.

Changes may be made in the above systems and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present systems and methods, which, as a matter of language, might be said to fall therebetween.

What is claimed is:

1. An image sensor with quantum efficiency enhanced by inverted pyramids, comprising:
   a semiconductor substrate including an array of pixels, each of the pixels being configured to convert light incident on the pixel to an electrical output signal, the semiconductor substrate having a top surface for receiving the light, the top surface forming a plurality of inverted pyramids in each pixel, each of the pixels having a 2×2 or 3×3 array of the inverted pyramids; and
   a plurality of microlenses disposed above the top surface and aligned to the plurality of inverted pyramids, respectively.

2. The image sensor of claim 1, wherein (i) each of microlenses has a lens surface, and (ii) for each pixel, the lens surfaces of the microlenses disposed over the pixel have no gaps therebetween in dimension orthogonal to optical axes of the microlenses.

3. The image sensor of claim 1, each of the pixels having a square cross section in a plane orthogonal to optical axes of the microlenses, the square cross section having side length $L_p$, each of the pixels having exactly N×N of the inverted pyramids, wherein $N < L_p/(0.8 \text{ microns})$.

4. The image sensor of claim 1, apex of each inverted pyramid coinciding with optical axis of a respective one of the microlenses.

5. An image sensor with quantum efficiency enhanced by inverted pyramids, comprising:
   a semiconductor substrate including an array of pixels, each of the pixels being configured to convert light incident on the pixel to an electrical output signal, the semiconductor substrate having a top surface for receiving the light, the top surface forming a plurality of inverted pyramids in each pixel;
   a plurality of microlenses disposed above the top surface and aligned to the plurality of inverted pyramids, respectively; and
   a color filter array disposed between the semiconductor substrate and the plurality of microlenses, each color filter of the color filter array covering a respective one of the pixels, the color filter array including (a) a set of near-infrared filters transmissive to near-infrared light, and (b) first, second, and third sets of visible color filters transmissive to respective first, second, and third colors of visible light, wavelength of the second color being shorter than wavelength of the third color and longer than wavelength of the first color.

6. The image sensor of claim 5, the color filter array forming a planar upper surface supporting the microlenses, each of the microlenses disposed above one of the near-infrared filters having a height, from the planar upper surface, that exceeds height, from the planar upper surface, of each of the microlenses disposed above one of the visible color filters.

7. The image sensor of claim 6, each of the microlenses disposed above one of the visible color filters in the second set having a height, from the planar upper surface, that (i) exceeds height, from the planar upper surface, of each of the microlenses disposed above one of the visible color filters in the first set and (ii) is exceeded by height, from the planar upper surface, of each of the microlenses disposed above one of the visible color filters in the third set.

8. The image sensor of claim 5, the color filter array forming a planar upper surface supporting the microlenses, each of the inverted pyramids positioned below one of the near-infrared filters having a depth that exceeds depth of each of the inverted pyramids positioned below one of the visible color filters.

9. The image sensor of claim 8, each of the inverted pyramids positioned below one of the visible color filters in the second set having a depth that (i) exceeds depth of each of the inverted pyramids positioned below one of the visible color filters in the first set and (ii) is exceeded by depth of each of the inverted pyramids positioned below one of the visible color filters in the third set.

10. An image sensor with quantum efficiency enhanced by inverted pyramids, comprising:
    a semiconductor substrate including an array of pixels, each of the pixels being configured to convert light incident on the pixel to an electrical output signal, the semiconductor substrate having a top surface for receiving the light, the top surface forming a plurality of inverted pyramids in each pixel; and
    a plurality of microlenses disposed above the top surface and aligned to the plurality of inverted pyramids, respectively, each microlens being configured such that a focal point for green light is above a base of the inverted pyramid and a focal point for near-infrared light is in the inverted pyramid.

11. The image sensor of claim 10, each microlens being configured such that a focal point for green light is above a base of the inverted pyramid and a focal point for near-infrared light is within 0.1 microns of the base.

12. The image sensor of claim 10, each inverted pyramid having four sides arranged along {111} crystal planes of the semiconductor substrate.

13. The image sensor of claim 10, sides of the inverted pyramids being at an angle, to optical axes of the microlenses, that is between 20 and 60 degrees.

14. The image sensor of claim 10, each of the microlenses having a first extent transverse to its optical axis, each of the inverted pyramids having a second extent, in dimensions orthogonal to the optical axis of the respective microlens, that is less than the first extent, such that bases of the inverted pyramids are at a planar portion of the top surface.

* * * * *